(12) United States Patent
Xie et al.

(10) Patent No.: US 12,295,240 B2
(45) Date of Patent: May 6, 2025

(54) DISPLAY SUBSTRATE AND DISPLAY APPARATUS

(71) Applicant: BOE Technology Group Co., Ltd., Beijing (CN)

(72) Inventors: Chunyan Xie, Beijing (CN); Paoming Tsai, Beijing (CN); Song Zhang, Beijing (CN); Li Jia, Beijing (CN); Tao Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/780,530

(22) PCT Filed: Jul. 28, 2021

(86) PCT No.: PCT/CN2021/109063
§ 371 (c)(1),
(2) Date: May 27, 2022

(87) PCT Pub. No.: WO2023/004647
PCT Pub. Date: Feb. 2, 2023

(65) Prior Publication Data
US 2024/0164183 A1    May 16, 2024

(51) Int. Cl.
*H10K 59/80* (2023.01)
*H10K 59/131* (2023.01)

(52) U.S. Cl.
CPC ......... *H10K 59/873* (2023.02); *H10K 59/131* (2023.02)

(58) Field of Classification Search
CPC .................. H10K 59/873; H10K 59/131
See application file for complete search history.

(56) References Cited

U.S. PATENT DOCUMENTS

| 2019/0074459 A1 | 3/2019 | Kim et al. |
| 2019/0333972 A1 | 10/2019 | Ding et al. |

(Continued)

FOREIGN PATENT DOCUMENTS

| CN | 108666347 A | 10/2018 |
| CN | 110416435 A | 11/2019 |

(Continued)

OTHER PUBLICATIONS

Office Action dated Dec. 5, 2024 for CN 202110985487.3 and English Translation.

*Primary Examiner* — Mark V Prenty
(74) *Attorney, Agent, or Firm* — Ling Wu; Stephen Yang; Ling and Yang Intellectual Property

(57) ABSTRACT

Disclosed are a display substrate and a display apparatus. The display substrate includes a display region, an opening region located in the display region, and a frame region located between the display region and the opening region. The frame region at least includes a first isolation region, and the first isolation region includes at least one signal line group and at least one organic insulation layer which are stacked. At least two first isolation grooves are disposed in the at least one organic insulation layer, the at least two first isolation grooves are disposed at intervals along a direction away from the opening region, and an orthographic projection of the signal line group in the frame region is located between orthographic projections of the at least two first isolation grooves in the frame region.

19 Claims, 9 Drawing Sheets

(56) References Cited

U.S. PATENT DOCUMENTS

| | | |
|---|---|---|
| 2020/0006701 A1 | 1/2020 | Lee et al. |
| 2020/0295112 A1 | 9/2020 | Kim et al. |
| 2021/0091148 A1 | 3/2021 | Kim et al. |
| 2022/0190289 A1 | 6/2022 | Ochi et al. |
| 2022/0359632 A1 | 11/2022 | Yang et al. |
| 2024/0164183 A1* | 5/2024 | Xie ..................... H10K 59/131 |

FOREIGN PATENT DOCUMENTS

| | | |
|---|---|---|
| CN | 110518141 A | 11/2019 |
| CN | 110610970 A | 12/2019 |
| CN | 110634928 A | 12/2019 |
| CN | 110660826 A | 1/2020 |
| CN | 110660930 A | 1/2020 |
| CN | 110707126 A | 1/2020 |
| CN | 210296381 U | 4/2020 |
| CN | 111430440 A | 7/2020 |
| CN | 210926064 U | 7/2020 |
| CN | 111697026 A | 9/2020 |
| CN | 111782080 A | 10/2020 |
| CN | 211929490 U | 11/2020 |
| CN | 212161815 U | 12/2020 |
| CN | 112740415 A | 4/2021 |
| KR | 10-2020-0017677 A | 2/2020 |
| WO | 2020202325 A1 | 10/2020 |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/109063 having an international filing date of Jul. 28, 2021. The entire content of the above-identified application is hereby incorporated by reference.

TECHNICAL FIELD

Embodiments of the present disclosure relate to, but are not limited to, the field of display technologies, and specifically relate to a display substrate and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, a low cost, etc. With constant development of display technologies, a flexible display apparatus (Flexible Display), in which an OLED or a Quantum dot Light Emitting Diode (QLED) is used as a light emitting device and signal control is performed through a Thin Film Transistor (TFT for short), has become a mainstream product in the field of display at present.

For smart terminal products, most manufacturers are pursuing a higher screen-to-body ratio, such as a full screen and a borderless screen, so as to bring more dazzling visual impact to users. Since hardware such as a front camera and a light sensor is usually required for products such as smart terminals, a solution of providing an opening region in a valid display region of an OLED display screen to set up hardware such as a camera is attracting great attention in the industry.

At present, one of difficulties in the solution of providing the opening region in the valid display region of the OLED display screen lies in effectiveness of encapsulation. Since a side wall of the opening region expose an emitting layer and a cathode, water and oxygen in the atmosphere will invade the valid display region along the emitting layer, causing the emitting layer in the valid display region to fail, resulting in poor display.

SUMMARY

The following is a summary about subject matters described herein in detail. This summary is not intended to limit the scope of protection of claims.

In a first aspect, an embodiment of the present disclosure provides a display substrate, which includes a display region, an opening region located in the display region, and a frame region located between the display region and the opening region, the frame region at least includes a first isolation region, the first isolation region includes at least one signal line group and at least one organic insulation layer which are stacked, the at least one organic insulation layer is provided with at least two first isolation grooves, the at least two first isolation grooves isolate the at least one organic insulation layer, the at least two first isolation grooves are disposed at intervals along a direction away from the opening region, and an orthographic projection of the at least one signal line group in the frame region is located in an orthographic projection of an interval between the at least two first isolation grooves in the frame region.

In an exemplary implementation mode, the first isolation region includes at least two signal line groups which are stacked, and orthographic projections of the at least two signal line groups in the frame region are at least partially overlapped.

In an exemplary implementation mode, at least one of the first isolation grooves is disposed with a first barrier layer.

In an exemplary implementation mode, at least one second isolation groove is further disposed in the at least one organic insulation layer, the at least one second isolation groove has an undercut structure, an emitting layer disposed on the at least one organic insulation layer, and the second isolation groove isolates the emitting layer.

In an exemplary implementation mode, the at least one second isolation groove is located between the at least two first isolation grooves.

In an exemplary implementation mode, an encapsulation structure and a dam spacer are stacked on the first isolation region, the encapsulation structure at least includes an organic layer, the dam spacer is located on a side of the first isolation region close to the opening region, and the dam spacer isolates the organic layer from the opening region.

In an exemplary implementation mode, the frame region further includes a second isolation region located between the first isolation region and the opening region, the second isolation region includes at least two pillar spacers disposed at intervals, and a third isolation groove is formed between adjacent pillar spacers, and the third isolation groove has an undercut structure.

In an exemplary implementation mode, a fourth isolation groove is further formed between adjacent pillar spacers, and a second barrier layer is disposed on the fourth isolation groove.

In an exemplary implementation mode, the pillar spacers and the at least one organic insulation layer are arranged in a same layer.

In an exemplary implementation mode, an encapsulation structure and a dam spacer are stacked on the first isolation region, the encapsulation structure at least includes an organic layer, the dam spacer is located on a side of the first isolation region close to the opening region, the dam spacer isolates the organic layer from the second isolation region, and a protection layer is disposed on the second isolation region.

In an exemplary implementation mode, a surface of the protection layer on a side away from the second isolation region is flush with a surface of the encapsulation structure on a side away from the first isolation region.

In an exemplary implementation mode, a shading layer is disposed on the protection layer.

In an exemplary implementation mode, a metal layer or an opaque black inorganic coating is adopted for the shading layer.

In an exemplary implementation mode, a buffer layer is disposed between the shading layer and the protection layer.

In an exemplary implementation mode, a notch is disposed on a side of the buffer layer close to the opening region, and the shading layer fills the notch.

In a second aspect, an embodiment of the present disclosure further provides a display apparatus including the foregoing display substrate.

After the accompanying drawings and detailed description are read and understood, other aspects may be understood.

DETAILED DESCRIPTION

Figure 1:
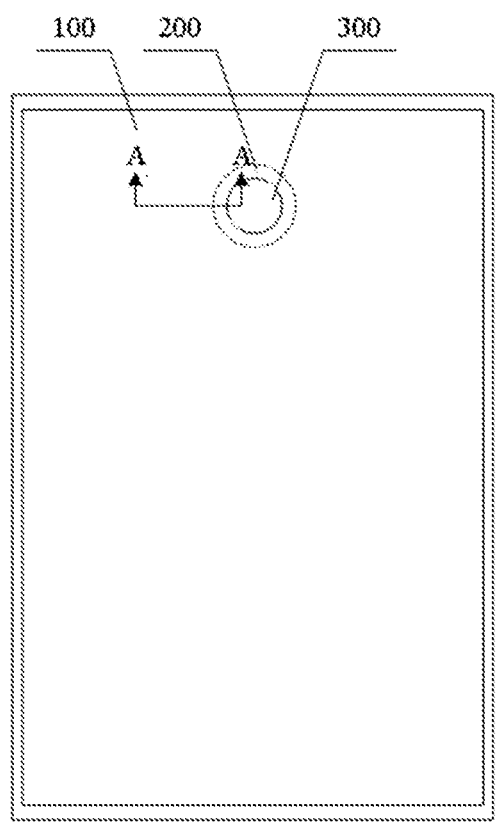
FIG. 1 is a schematic diagram of a structure of a display substrate according to an embodiment of the present disclosure.

The embodiments of the present disclosure will be described in detail below in combination with the drawings. It is to be noted that implementation modes may be implemented in multiple different forms. Those of ordinary skill in the art may easily understand such a fact that manners and contents may be transformed into various forms without departing from the spirit and scope of the present disclosure. Therefore, the present disclosure should not be interpreted as being limited to contents recorded in the following implementation modes only. The embodiments in the present disclosure and features in the embodiments may be arbitrarily combined with each other without conflicts.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to a direction in which various constituent elements are described. Therefore, description is not limited to the wordings used in the specification, and appropriate substitutions may be made according to situations.

In the specification, unless otherwise specified and defined explicitly, terms "mount", "mutually connect", and "connect" should be understood in a broad sense. For example, a connection may be a fixed connection, a detachable connection, or an integrated connection; it may be a mechanical connection or an electrical connection; it may be a direct connection, an indirect connection through intermediate components, or communication inside two components. For those of ordinary skills in the art, meanings of the abovementioned terms in the present disclosure may be understood according to situations.

In the present disclosure, "about" refers to that a boundary is defined not so strictly and numerical values within process and measurement error ranges are allowed.

An embodiment of the present disclosure provides a display substrate, which includes a display region, an opening region, and a frame region located between the display region and the opening region. The frame region at least includes a first isolation region. The first isolation region includes a base substrate, at least one inorganic insulation layer disposed on the base substrate, at least one organic insulation layer disposed on a side of the at least one inorganic insulation layer away from the base substrate, and an encapsulation structure disposed on a side of the at least one organic insulation layer away from the base substrate. The encapsulation structure at least includes one organic material layer. The display substrate includes at least two first isolation grooves, and the at least two first isolation grooves penetrate the at least one organic insulation layer. The at least two first isolation grooves at least include a first edge groove and a second edge groove. In first isolation grooves, of which an orthographic projection of a bottom wall on the base substrate is overlapped with an orthographic projection of the organic material layer on the base substrate, a first isolation groove which is closest to a side of the display region is the first edge groove. In first isolation grooves, of which an orthographic projection of a bottom wall on the base substrate is not overlapped with the orthographic projection of the organic material layer on the base substrate, a first isolation groove which is closest to a side of the display region is the second edge groove. The display substrate further includes at least one signal line group disposed on the base substrate, and an orthographic projection of the at least one signal line group on the base substrate is located between an orthographic projection of a bottom wall of the first edge groove on the base substrate and an orthographic projection of a bottom wall of the second edge groove on the base substrate.

Figure 2:
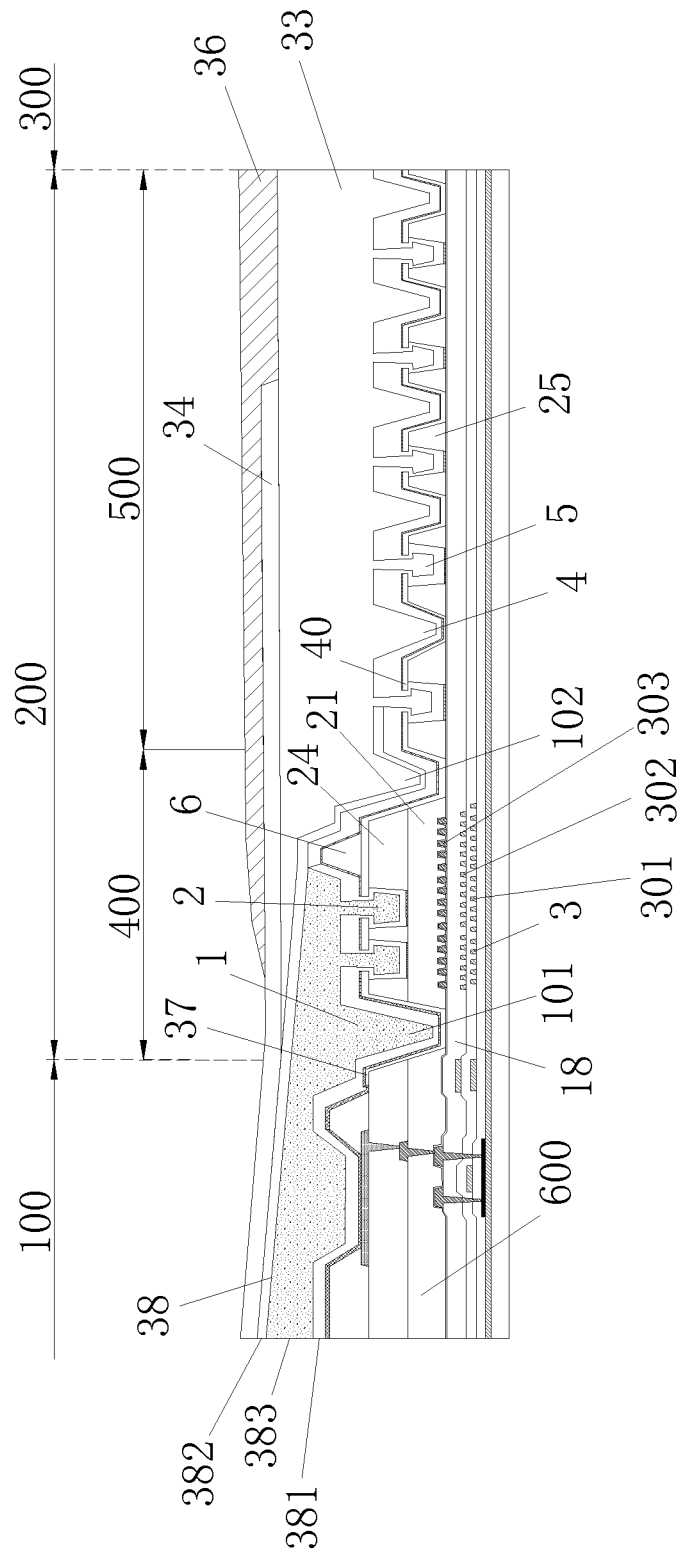
FIG. 2 is a sectional view of a display substrate according to an embodiment of the present disclosure.

FIG. 1 is a schematic diagram of a structure of a display substrate according to an embodiment of the present disclosure; and FIG. 2 is a sectional view of the display substrate according to the embodiment of the present disclosure. Description is made by taking a case that FIG. 2 is a sectional view along an A-A direction of FIG. 1 as an example. The display substrate according to the embodiment of the present disclosure may be an OLED display substrate or a QLED display substrate. Description is made by taking a case that the display substrate according to the embodiment of the present disclosure may be an OLED display substrate as an example. As shown in FIG. 1, on a plane parallel to the display substrate, a main body structure of the display substrate includes a display region 100, a frame region 200, and an opening region 300, and the frame region 200 is located between the display region 100 and the opening region 300. The frame region 200 surrounds a periphery of the opening region 300 and may be used for blocking a water and oxygen path invading from the opening region 300 to the display region 100. A position of the opening region 300 in the display region 100 is not limited, a shape thereof is also not limited, and may be a circle as shown in FIG. 1, or an ellipse, a square, a rhombus, or another polygon.

On the plane parallel to the display substrate, the display region 100 may include at least one gate line and at least one data line. The gate line may be used for transmitting a gate electrical signal, and the data line may be used for transmitting a data electrical signal. The at least one gate line extends along a first direction (e.g. a horizontal direction), and the at least one gate line may be parallel to each other. The at least one data line extends along a second direction (e.g. a vertical direction), and the at least one data line may be parallel to each other. Herein, the first direction is different from the second direction. For example, the first direction is perpendicular to the second direction. The gate line and the data line define at least one sub-pixel.

On a plane perpendicular to the display substrate, the display region 100 may include a base substrate, a drive structure layer disposed on the base substrate, and an emitting structure layer disposed on the drive structure layer, the drive structure layer mainly includes at least one Thin Film Transistor (TFT), the emitting structure layer mainly includes at least one anode, at least one emitting layer, and at least one cathode. The anode in the emitting structure layer is connected with a drain electrode in the thin film transistor, the data line is connected with a source electrode in the thin film transistor, and the gate line is connected with a gate electrode in the thin film transistor. The thin film transistor may be turned on or off through a gate electrical signal applied by the gate line connected thereto, and may transmit a data electrical signal provided by the data line connected thereto to the anode. Sub-pixels of the display region 100 may display an image according to the data electrical signal applied to the anode.

In some embodiments, the source electrode and the drain electrode in the thin film transistor may be interchanged according to a type of the thin film transistor, which will not repeated in the embodiment of the present disclosure.

As shown in FIG. 1, the opening region 300 includes at least one through hole or blind hole, each structural film layer and base substrate of the through hole are removed, and most of structural film layers in the blind hole are removed. The through hole or blind hole may be used for setting corresponding hardware, such as a camera and a sensor. The foregoing structural film layer may include each film layer in the drive structure layer, each film layer in the emitting structure layer, and the like.

FIG. 2 is illustrated by only taking one sub-pixel as an example. As shown in FIG. 2, the drive structure layer of the sub-pixel in the display region 100 mainly includes a buffer layer disposed on the base substrate and a thin film transistor disposed on the buffer layer. The emitting structure layer mainly includes an anode connected with the drain electrode of the thin film transistor, a pixel definition layer defining a pixel opening region, an emitting layer, a cathode formed on the emitting layer, and an encapsulation structure. The emitting layer at least covers the pixel opening region. For example, the emitting layer covers the entire pixel opening region or the entire sub-pixel.

As shown in FIG. 2, on a plane parallel to the display substrate, the frame region 200 in the display substrate according to the embodiment of the present disclosure at least includes a first isolation region 400. On a plane perpendicular to the display substrate, the first isolation region 400 includes a base substrate 10, at least one inorganic insulation layer 18 disposed on the base substrate 10, at least one organic insulation layer 600 disposed on a side of the at least one inorganic insulation layer 18 away from the base substrate 10, and at least one encapsulation structure 38 disposed on a side of the at least one organic insulation layer 600 away from the base substrate 10. The encapsulation structure 38 at least includes one organic material layer. A signal line group 3 includes at least one signal line. At least two first isolation grooves 1 are disposed in the at least one organic insulation layer 600. The at least two first isolation grooves 1 penetrate the at least one organic insulation layer 600. The at least two first isolation grooves 1 at least include a first edge groove 101 and a second edge groove 102. In first isolation grooves 1, of which an orthographic projection of a bottom wall on the base substrate 10 is overlapped with an orthographic projection of an organic material layer 383 on the base substrate 10, a first isolation groove 1 which is closest to a side of the display region 100 is the first edge groove 101. In first isolation grooves 1, of which an orthographic projection of a bottom wall on the base substrate 10 is not overlapped with the orthographic projection of the organic material layer 383 on the base substrate 10, a first isolation groove 1 which is closest to a side of the display region 100 is the second edge groove 102. An orthographic projection of the at least one signal line group 3 on the base substrate 10 is located between an orthographic projection of a bottom wall of the first edge groove 101 on the base substrate 10 and an orthographic projection of a bottom wall of the second edge groove 102 on the base substrate 10.

In an exemplary implementation mode, bottom walls of the at least two first isolation grooves 1 are located on a surface of the inorganic insulation layer 18 on a side away from the base substrate 10; or, bottom walls of the at least two first isolation grooves 1 are located in the inorganic insulation layer 18, i.e., the bottom walls of the at least two first isolation grooves 1 are over-etched into the inorganic insulation layer 18.

In an exemplary implementation mode, a base substrate is disposed in each region other than the opening region 300 in the display substrate of the embodiment, and base substrates in the display substrate are all disposed in a same layer and prepared through a same preparation process using a same material. For example, a base substrate in the display region 100 and the base substrate 10 in the frame region 200 are disposed in a same layer and are prepared through a same preparation process using a same material.

In an exemplary implementation mode, the organic insulation layer in the display region 100 and the organic insulation layer 600 in the frame region 200 are disposed in a same layer and are prepared through a same preparation process using a same material.

In an exemplary implementation mode, the inorganic insulation layer in the display region 100 and the inorganic insulation layer 18 in the frame region 200 are disposed in a same layer and are prepared through a same preparation process using a same material.

In an exemplary implementation mode, an orthographic projection of the first isolation region 400 on the base substrate has two edges, an edge of the two edges on a side close to the display region 100 is overlapped with an edge of an orthographic projection of the first edge groove 101 on the base substrate on a side close to the display region 100; and an edge of the two edges on a side close to the opening region 300 is overlapped with an edge of an orthographic projection of the second edge groove 102 on the base substrate on a side close to the opening region 300.

In an exemplary implementation mode, a first isolation groove 1 includes at least one side wall and a bottom wall. For example, the first edge groove 101 includes two side walls and one bottom wall; and the second edge groove 102 includes two side walls and one bottom wall.

An orthographic projection of the signal line group 3 on the base substrate 10 in the display substrate according to the embodiment of the present disclosure is located between an orthographic projection of a bottom wall of the first edge groove 101 on the base substrate 10 and an orthographic projection of a bottom wall of the second edge groove 102 on the base substrate 10. A first isolation groove 1 is prevented from affecting a wiring of the signal line group 3, so that the signal line group 3 is wound in the first isolation region 400, an area of the frame region 200 is reduced, and a narrow frame design is achieved.

The first isolation groove 1 in the display substrate according to the embodiment of the present disclosure may has an annular structure surrounding the opening region 300. The first isolation groove 1 may be used for isolating the organic insulation layer 600 in the frame region 200, thus a path of water and oxygen invading from the opening region 300 to the display region through the organic insulation layer 600 is blocked.

In an exemplary implementation mode, the organic insulation layer 600 may be made of an organic material such as a resin, a polysiloxane-based material, an acrylic-based material, or a polyimide-based material.

In an exemplary implementation mode, on a plane perpendicular to the display substrate, the first isolation region 400 may include at least one organic insulation layer 600, for example, the first isolation region 400 includes one, two, three, or other number of organic insulation layers 600 stacked. At least one of the organic insulation layers 600 in the first isolation region 400 and at least one of organic insulation layers of the display region may be disposed in a same layer, and formed through a same process using a same material.

In an exemplary implementation mode, on a plane perpendicular to the display substrate, the first isolation groove 1 may penetrate all the organic insulation layers 600 in the first isolation region 400 to completely isolate the organic insulation layers 600 in the first isolation region 400; or, the first isolation groove 1 may penetrate a portion of the organic insulation layers 600 in the first isolation region 400 to isolate a portion of the organic insulation layers 600 in the first isolation region 400. For example, the first isolation region 400 includes a first organic insulation layer 21 and a second organic insulation layer 24 stacked, and the first organic insulation layer 21 is located between the second organic insulation layer 24 and the base substrate. The first isolation groove 1 penetrates the first organic insulation layer 21 and the second organic insulation layer 24, i.e. a depth of the first isolation groove 1 is not less than a sum of thicknesses of the first organic insulation layer 21 and the second organic insulation layer 24, as shown in FIG. 2.

In an exemplary implementation mode, the first isolation region 400 may include at least one signal line group 3, for example, the first isolation region 400 may include two, three, or other number of signal line groups 3 stacked.

Figure 3:
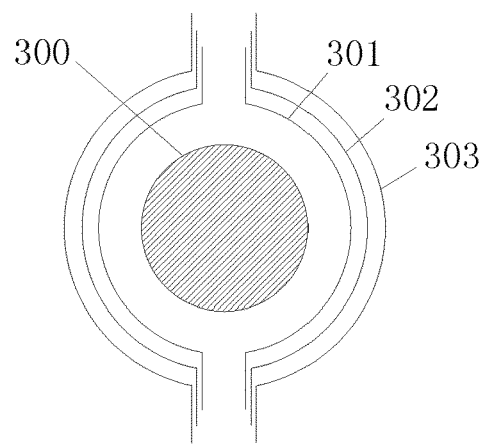
FIG. 3 is a first schematic diagram of a winding of a signal line group of a first isolation region in a display substrate according to an embodiment of the present disclosure.

FIG. 3 is a first schematic diagram of a winding of a signal line group of a first isolation region in a display substrate according to an embodiment of the present disclosure. FIG. 3 illustrates a winding of the signal line group 3 according to the embodiment of the present disclosure by taking the first isolation region 400 including three signal line groups 3 that are stacked as an example. As shown in FIG. 3, the display substrate according to the embodiment of the present disclosure has a rectangular structure, including short sides disposed oppositely and long sides disposed oppositely. A center of the opening region 300 in the display substrate according to the embodiment of the present disclosure is located on a center line of the short sides of the display substrate. According to the embodiment of the present disclosure, the first isolation region 400 of the display substrate includes three signal line groups 3 that are stacked, and the three signal line groups 3 are respectively a first signal line group 301, a second signal line group 302, and a third signal line group 303 sequentially stacked. The third signal line group 303 is located on a side of the signal line groups 3 away from the base substrate 10, and the organic insulation layer 600 is disposed on a side of the third signal line group 303 away from the base substrate 10 and covers the third signal line group 303. The three signal line groups 3 bypass the opening region 300 in the first isolation region 400 in a form of a winding.

In an exemplary implementation mode, the first signal line group 301, the second signal line group 302, and the third signal line group 303 are not limited in the embodiment of the present disclosure. For example, the first signal line group 301 may be a first gate line, the second signal line group 302 may be a second gate line, and the third signal line group 303 may be a first data line.

Figure 20:
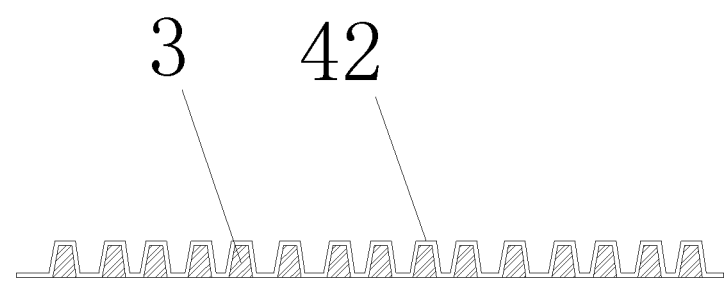
FIG. 20 is an enlarged view of a signal line group in a display substrate according to an embodiment of the present disclosure.

FIG. 20 is an enlarged view of a signal line group in a display substrate according to an embodiment of the present disclosure. In an exemplary implementation mode, as shown in FIG. 20, a barrier layer 42 is disposed on a side of the at least one signal line group 3 away from the base substrate 10, and the barrier layer 42 covers the at least one signal line group 3 to prevent the at least one signal line group 3 from being corroded. The barrier layer 42 may be made of an inorganic material.

In an exemplary implementation mode, the barrier layer 42 may be a continuous film layer covering an entire layer of the signal line group 3, as shown in FIG. 20. Or, the barrier layer may include at least one patterned film layer covering at least one signal line in the signal line group 3.

In an exemplary implementation mode, in the display substrate according to the embodiment of the present disclosure, a distance from a side edge of the frame region 200 away from the opening region 300 to a side edge of the frame region 200 close to the opening region 300 may be less than 0.4 mm. For example, the distance from the side edge of the frame region 200 away from the opening region 300 to the side edge of the frame region 200 close to the opening region 300 is 0.2 mm to 0.3 mm.

Figure 4:
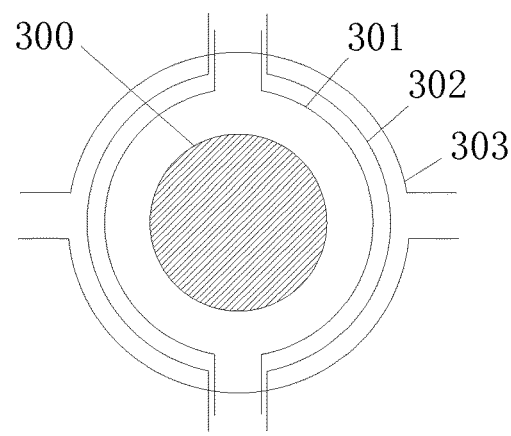
FIG. 4 is a second schematic diagram of a winding of a signal line group of a first isolation region in a display substrate according to an embodiment of the present disclosure.

FIG. 4 is a second schematic diagram of a winding of a signal line group of a first isolation region in a display substrate according to an embodiment of the present disclosure. FIG. 4 illustrates the winding of the signal line group 3 according to the embodiment of the present disclosure by taking the frame region 200 including three signal line groups 3 that are stacked as an example. As shown in FIG. 4, the display substrate according to the embodiment of the present disclosure has a rectangular structure, including short sides disposed oppositely and long sides disposed oppositely. The center of the opening region 300 in the display substrate according to the embodiment of the present disclosure is not located on a center line of the short sides of the display substrate. According to the embodiment of the present disclosure, the first isolation region 400 of the display substrate includes three signal line groups 3 that are stacked, and the three signal line groups 3 are respectively a first signal line group 301, a second signal line group 302, and a third signal line group 303 sequentially stacked. Sub-pixels in the display region 100 are driven bilaterally, which may eliminate an uneven display phenomenon caused by driving pixels surrounding the opening region 300.

In the display substrate according to the embodiment of the present disclosure, space occupied by the winding of the signal line group 3 is smaller than the first isolation region 400, and the winding of the signal line group 3 does not increase space of the frame region 200. In addition, when a pixel density of the display substrate of the embodiment of the present disclosure is increased, a quantity of signal line groups 3 will be increased, however, no additional space of the frame region 200 will be occupied as long as an orthographic projection of the signal line groups 3 in the frame region 200 is located between an orthographic projection of an interval of the at least two first isolation grooves 1 in the frame region 200 so that space occupied by windings of the signal line groups 3 is smaller than the first isolation region 400.

In an exemplary implementation mode, on a plane perpendicular to the display substrate, as shown in FIG. 2, the first isolation region 400 includes at least two signal line groups 3 stacked. The at least two signal line groups 3 are insulated from each other, orthographic projections of the at least two signal line groups 3 on the base substrate 10 are at least partially overlapped, thereby reducing space occupied by windings of the signal line groups 3 in the frame region 200. An orthographic projection of a signal line group 3 on the base substrate 10 refers to a projection between signal lines located at two opposite edges of the signal line group 3 in the signal line group 3.

In an exemplary implementation mode, orthographic projections of regions where the at least two signal line groups 3 are located on the base substrate 10 are at least partially overlapped. For example, the first isolation region 400 includes a first signal line group 301, a second signal line group 302, and a third signal line group 303 which are stacked, an orthographic projection of a region where the first signal line group 301 is located on the base substrate 10 is at least partially overlapped with an orthographic projection of a region where the second signal line group 302 is located on the base substrate; or, the orthographic projection of the region where the first signal line group 301 is located on the base substrate is at least partially overlapped with an orthographic projection of a region where the third signal line group 303 is located on the base substrate 10; or, the orthographic projection of the region where the second signal line group 302 is located on the base substrate 10 is at least partially overlapped with the orthographic projection of the region where the third signal line group 303 is located on the base substrate 10.

In an exemplary implementation mode, orthographic projections of signal lines in the at least two signal line groups 3 on the base substrate 10 are at least partially overlapped. For example, the first isolation region 400 includes a first signal line group 301 including at least one first signal line, a second signal line group 302 including at least one second signal line, and a third signal line group 303 including at least one third signal line, which are stacked. An orthographic projection of the at least one first signal line in the first signal line group 301 on the base substrate 10 is at least partially overlapped with an orthographic projection of the at least one second signal line in the second signal line group 302 on the base substrate; or, the orthographic projection of the at least one first signal line in the first signal line group 301 on the base substrate is at least partially overlapped with an orthographic projection of the at least one third signal line in the third signal line group 303 on the base substrate 10; or, the orthographic projection of the at least one second signal line in the second signal line group 302 on the base substrate 10 is at least partially overlapped with the orthographic projection of the at least one third signal line in the third signal line group 303 on the base substrate 10.

Figure 22:
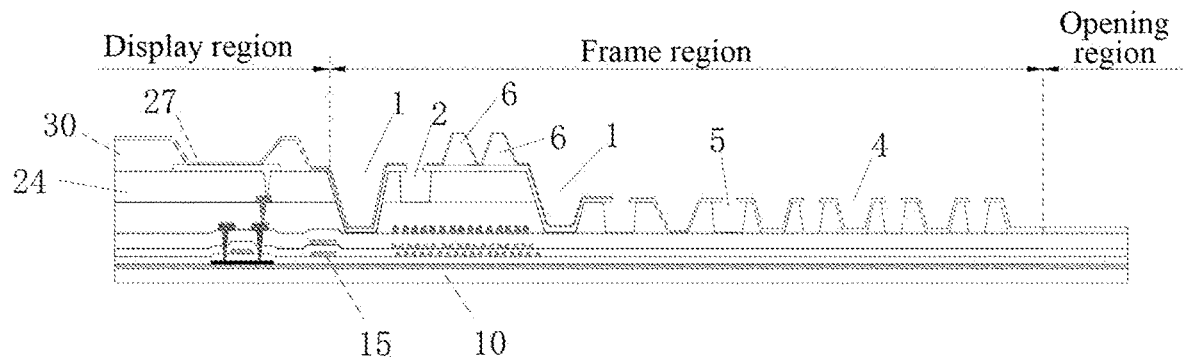
FIG. 22 is a schematic diagram of a structure after forming a dam spacer according to an embodiment of the present disclosure.
Figure 23:
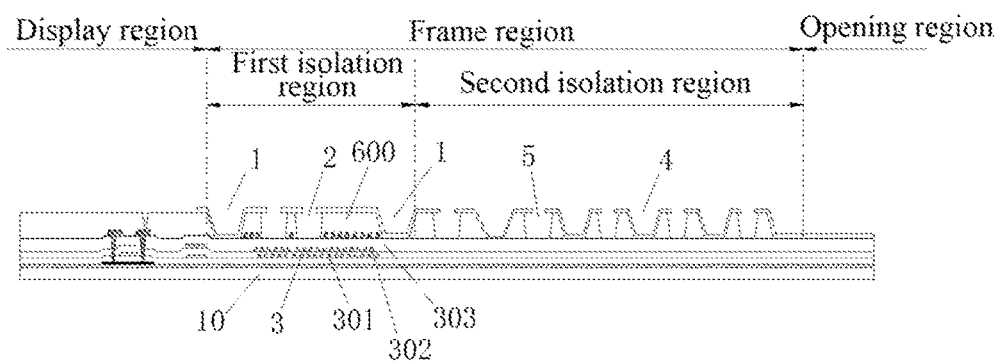
FIG. 23 is a second schematic diagram of a display substrate after forming a first organic insulation layer according to an embodiment of the present disclosure.

FIG. 23 is a second schematic diagram of a display substrate after forming a first organic insulation layer according to an embodiment of the present disclosure. In an exemplary implementation mode, as shown in FIG. 22, in the display substrate according to the embodiment of the present disclosure, the first isolation region 400 includes three signal line groups 3 stacked, which are respectively a first signal line group 301, a second signal line group 302, and a third signal line group 303 sequentially stacked. The third signal line group 303 is located on a side of the signal line groups 3 away from the base substrate 10. An organic insulation layer 600 is disposed on a side of the third signal line group 303 away from the base substrate 10, and the organic insulation layer 600 covers the third signal line group 303. At least two first isolation grooves 1 and at least one second isolation groove 2 are disposed in the organic insulation layer 600. An orthographic projection of the third signal line group 303 on the base substrate 10 is not overlapped with groove bottoms of the first isolation grooves 1 and a groove bottom of the second isolation groove 2.

In an exemplary implementation mode, a first isolation groove 1 includes at least one side wall and a bottom wall, a first barrier layer 37 is disposed on the at least one side wall and the bottom wall of the first isolation groove 1. The first barrier layer 37 may be used for blocking water and oxygen invading from the opening region 300 to the display region 100 through the organic insulation layer 600. The first barrier layer 37 may be referred to as a first passivation layer.

In an exemplary implementation mode, the first barrier layer 37 may be made of a metal oxide material or an inorganic material. For example, the inorganic material may be a material such as silicon nitride or silicon oxide, and the metal oxide material may be a material such as aluminum oxide, hafnium oxide, and tantalum oxide.

In an exemplary implementation mode, in a process of preparing the first barrier layer 37, first, an inorganic insulation layer 18 is formed on the base substrate 10; then, an organic insulation layer 600 is formed on the inorganic insulation layer 18, and a first isolation groove 1 penetrating the organic insulation layer 600 is formed in the organic insulation layer 600; finally, a first barrier layer 37 is formed on the first isolation groove 1, so that the first barrier layer 37 is in contact with a bottom wall and at least one side wall of the first isolation groove 1 and the inorganic insulation layer 18 is not in contact with the at least one side wall of the first isolation groove 1.

In an exemplary implementation mode, the at least one organic insulation layer 600 is also provided with at least one second isolation groove 2 having a first undercut structure. The first isolation region 400 further includes an emitting layer stacked on the at least one organic insulation layer 600 and the second isolation groove 2 may isolate the emitting layer. When the emitting layer is formed in the display region 100 of the display substrate according to the embodiment of the present disclosure, the emitting layer of the frame region 200 is broken at the second isolation groove 2 due to poor coverage of the undercut structure in the second isolation groove 2, and a path of water and oxygen invading from the opening region 300 to the display region through the emitting layer may be blocked.

In an exemplary implementation mode, in the display substrate according to the embodiment of the present disclosure, the second isolation groove 2 includes a side, and the first barrier layer 37 extends to the side of the second isolation groove 2 and protrudes from the side of the second isolation groove 2 to form the first undercut structure. In the embodiment of the present disclosure, the emitting layer will be broken due to poor step coverage of the first undercut structure when the emitting layer is formed through evaporation. The broken emitting layer will cover the bottom wall of the second isolation groove 2, thereby blocking the path of water and oxygen invading from the opening region 300 to the display region through the emitting layer, and improving reliability of a display panel.

In an exemplary implementation mode, the second isolation groove 2 may penetrate a portion of the organic insulation layers 600 in the frame region 400. For example, the first isolation region 400 includes a first organic insulation layer 21 and a second organic insulation layer 24 stacked, and the first organic insulation layer 21 is located between the second organic insulation layer 24 and the base substrate 10. The second isolation groove 2 penetrates the second organic insulation layer 24 and extends to a surface of the first organic insulation layer 21, i.e. a depth of the second isolation groove 2 is equal to a thickness of the second organic insulation layer 24, as shown in FIG. 2.

In an exemplary implementation mode, as shown in FIG. 2, an orthographic projection of the at least one second isolation groove 2 on the base substrate 10 is located between an orthographic projection of the first edge groove 101 on the base substrate 10 and an orthographic projection of the second edge groove 102 on the base substrate 10. The second isolation groove 2 penetrates only a portion of the organic insulation layers in the frame region, so that the second isolation groove 2 does not block a winding of a signal line group 3, and then the orthographic projection of the at least one second isolation groove 2 in the frame region 200 is at least partially overlapped with an orthographic projection of the signal line group 3 in the frame region 200, thereby achieving a narrow frame design.

In an exemplary implementation mode, the orthographic projection of the at least one second isolation groove 2 on the base substrate 10 is overlapped with an orthographic projection of the organic material layer 383 in the encapsulation structure 38 on the base substrate 10.

In an exemplary implementation mode, as shown in FIG. 2, the encapsulation structure 38 includes a first inorganic material layer 381, a second inorganic material layer 382, and at least one organic material layer 383 located between the first inorganic material layer 381 and the second inorganic material layer 382. The encapsulation structure 38 may be used for protecting a light emitting unit.

In an exemplary implementation mode, as shown in FIG. 2, in the display substrate according to the embodiment of the present disclosure, during a process of forming the encapsulation structure on the light emitting unit, a material of the encapsulation structure in the display region 100 is prevented from flowing into the opening region 300. In the display substrate according to the embodiment of the present disclosure, a dam spacer 6 may be disposed on the first isolation region 400, and the dam spacer 6 is disposed on a side of the organic insulation layer 600 in the first isolation region 400 away from the base substrate 10. An orthographic projection of the dam spacer 6 on the base substrate 10 is located between an orthographic projection of the first edge groove 101 on the base substrate 10 and an orthographic projection of the second edge groove 102 on the base substrate 10. The dam spacer 6 isolates the organic material layer 383 in the encapsulation structure 38 from the opening region 300 to block the organic material layer 383 from flowing into the opening region 300.

In an exemplary implementation mode, the dam spacer 6 and the pixel definition layer in the display region 200 may be arranged in a same layer, and formed through a same process using a same material. Or, the display region 200 further includes a spacer layer, and the dam spacer 6 and the spacer layer in the display region 200 may be arranged in a same layer and formed through a same process using a same material. Or, the display region 200 further includes a spacer layer, and the dam spacer 6 includes a first isolation layer and a second isolation layer which are stacked. The first isolation layer and the pixel definition layer in the display region 200 are arranged in a same layer, and formed through a same process using a same material, and the second isolation layer and the spacer layer in the display region 200 are arranged in a same layer, and formed through a same process using a same material.

FIG. 22 is a schematic diagram of a structure after forming a dam spacer according to an embodiment of the present disclosure. In an exemplary implementation mode, as shown in FIG. 22, at least two dam spacers 6 may be disposed on the first isolation region 400 of the display substrate according to the embodiment of the present disclosure, and the at least two dam spacers 6 are disposed on a side of the organic insulation layer 600 in the first isolation region 400 away from the base substrate 10. The at least two dam spacers 6 may be arranged at intervals. Orthographic projections of the at least two dam spacers 6 on the base substrate 10 is located between the orthographic projection of the first edge groove 101 on the base substrate 10 and the orthographic projection of the second edge groove 102 on the base substrate 10. The at least two dam spacers 6 isolate the organic material layer 383 in the encapsulation structure 38 from the opening region 300 to block the organic material layer 383 from flowing into the opening region 300.

In an exemplary implementation mode, a height relationship between the at least two dam spacers 6 is not limited as long as the at least two dam spacers 6 are capable of blocking the organic material layer 383 from flowing into the opening region 300. For example, heights of the at least two dam spacers 6 are equal; or, a height of one of the at least two dam spacers 6 is greater than a height of the other of the at least two dam spacers 6.

In an exemplary implementation mode, the frame region 200 further includes a second isolation region 500 located between the first isolation region 400 and the opening region 300. The second isolation region 500 includes at least two pillar spacers 25, a third isolation groove 5 is formed between adjacent pillar spacers 25, the third isolation groove 5 includes a side, a second barrier layer 40 is disposed on a side of the pillar spacers 25 away from the base substrate 10, and the second barrier layer 40 protrudes from the side of the third isolation groove 5 to form a second undercut structure. In the embodiment of the present disclosure, the emitting layer will be broken due to poor step coverage of the second undercut structure when the emitting layer is formed through evaporation. The broken emitting layer will cover a bottom wall of the third isolation groove 5, thereby blocking a path of water and oxygen invading from the opening region 300 to the display region through the emitting layer, and improving reliability of a display panel. Furthermore, the third isolation groove 5 can absorb a stress generated during a process of forming the opening region 300, and may prevent a crack generated when punching in the opening region 300 from extending to the display region 100, thus blocking the crack. The second barrier layer 40 may be referred to as a second passivation layer.

In an exemplary implementation mode, the pillar spacers 25 and at least one of the organic insulation layers 600 of the first isolation region 400 may be arranged in a same layer, and formed through a same process using a same material. For example, the first isolation region 400 includes a first organic insulation layer 21 and a second organic insulation layer 24 which are stacked, and the pillar spacers 25 and the second organic insulation layer 24 are arranged in a same layer, and are formed through a same process using a same material, as shown in FIG. 2. Or, the pillar spacers 25 and the first organic insulation layer 21 may be arranged in a same layer, and formed through a same process using a same material. Or, the pillar spacer 25 includes a first organic film layer and a second organic film layer which are stacked. The first organic film layer and the first organic insulation layer 21 are arranged in a same layer, and formed through a same process using a same material. The second organic film layer and the second organic insulation layer 24 are arranged in a same layer, and formed through a same process using a same material.

Figure 21:
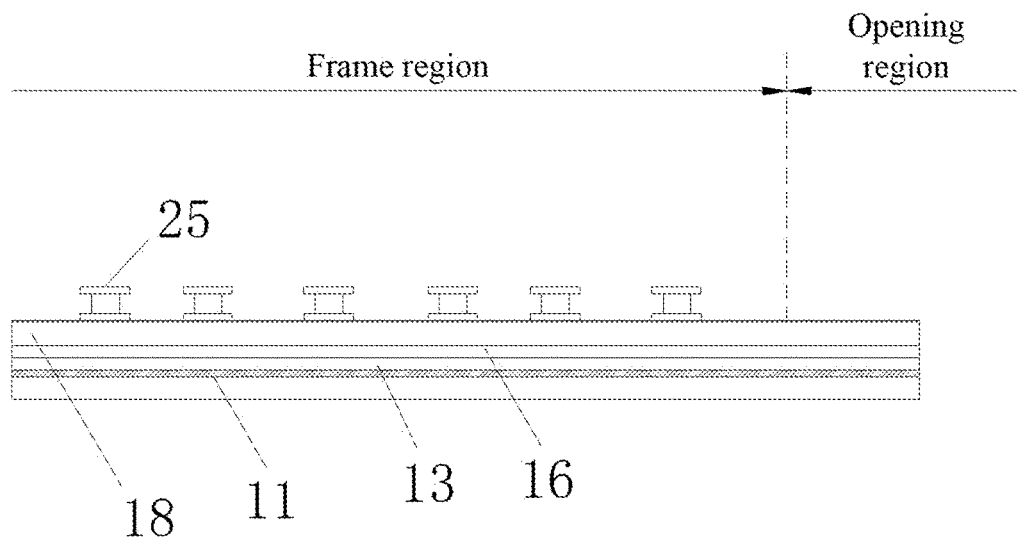
FIG. 21 is an enlarged view of a display substrate after forming a pillar spacer according to an embodiment of the present disclosure.

FIG. 21 is an enlarged view of a display substrate after forming a pillar spacer according to an embodiment of the present disclosure. In an exemplary implementation mode, as shown in FIG. 21, the pillar spacer 25 and the signal line group 3 may be arranged in a same layer, and formed through a same process using a same material. For example, a cross section of the pillar spacer 25 is in a shape of a Chinese character "⊥", and the pillar spacer 25 includes a first metal layer, a second metal layer, and a third metal layer which are stacked, the first metal layer and the third metal layer are made of metallic titanium, and the second metal layer is made of metallic aluminum. The cross section of the pillar spacer 25 is in the shape of the Chinese character "⊥", and due to poor coverage of the pillar spacer 25 in the shape of the Chinese character "⊥", the emitting layer is broken at the pillar spacer 25 when the emitting layer is formed through evaporation, thus a path of water and oxygen invading from the opening region 300 to the display region through the emitting layer is blocked, thereby improving reliability of a display panel.

Figure 24:
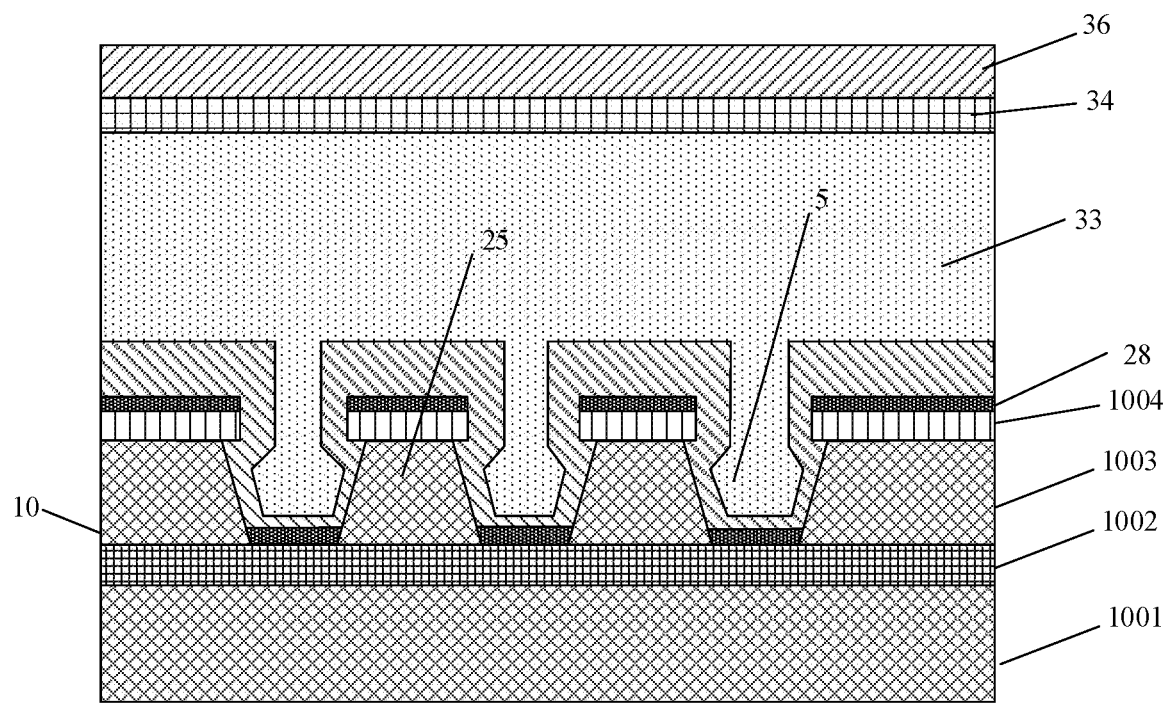
FIG. 24 is an enlarged view of a pillar spacer in a display substrate according to an embodiment of the present disclosure.

FIG. 24 is an enlarged view of a pillar spacer in a display substrate according to an embodiment of the present disclosure. In an exemplary implementation mode, as shown in FIG. 24, a multi-layer flexible base substrate structure is adopted for the base substrate 10. For example, a double-layer flexible base substrate structure is adopted for the base substrate 10. The base substrate 10 includes a first flexible base substrate 1001, a first isolation layer 1002 disposed on the first flexible base substrate 1001, a second flexible base substrate 1003 disposed on a side of the first isolation layer 1002 away from the first flexible base substrate 1001, and a second isolation layer 1004 disposed on a side of the second flexible base substrate 1003 away from the first flexible base substrate 1001. The first flexible base substrate 1001 and the second flexible base substrate 1003 may be made of a flexible base substrate material such as Polyimide (PI). The first isolation layer 1002 and the second isolation layer 1004 may be made of an inorganic insulation material.

In an exemplary implementation mode, as shown in FIG. 24, the pillar spacer 25, and the second flexible base substrate 1003 and the second isolation layer 1004 may be arranged in a same layer, and formed through a same process using a same material. A third isolation groove 5 is formed between adjacent pillar spacers 25, the third isolation groove 5 includes a side, and the second isolation layer 1004 protrudes from the side of the third isolation groove 5 to form a second undercut structure. In the embodiment of the present disclosure, the emitting layer 28 is broken due to poor step coverage of the second undercut structure when the emitting layer 28 is formed through evaporation. The broken emitting layer 28 covers a bottom wall of the third isolation groove 5, thereby blocking a path of water and oxygen invading from the opening region 300 to the display region through the emitting layer 28, and improving reliability of a display panel. Furthermore, the third isolation groove 5 can absorb a stress generated during a process of forming the opening region 300, and may prevent a crack generated when punching in the opening region 300 from extending to the display region 100, thus blocking the crack.

In an exemplary implementation mode, a depth of the third isolation groove 5 is not limited as long as the third isolation groove 5 can block the path of water and oxygen invading from the opening region 300 to the display region through the emitting layer 28. For example, the bottom wall of the third isolation groove 5 is located on a surface of the first isolation layer 1002; or, the bottom wall of the third isolation groove 5 is located in the second flexible base substrate 1003, i.e. the third isolation groove 5 does not penetrate the second flexible base substrate 1003.

In an exemplary implementation mode, as shown in FIG. 2, at least one fourth isolation groove 4 may also be formed between adjacent pillar spacers 25. The fourth isolation groove 4 includes at least one side wall and a bottom wall, and a second barrier layer 40 is disposed on the at least one side wall and the at least one bottom wall of the fourth isolation groove 4. The second barrier layer 40 may be used for blocking water and oxygen invading from the opening region 300 to the display region 100 through a pillar spacer 25.

In an exemplary implementation mode, the second barrier layer 40 may and the first barrier layer 37 may be arranged in a same layer, and formed through a same process using a same material.

In an exemplary implementation mode, the second barrier layer 40 may be made of a metal oxide material or an inorganic material. For example, the inorganic material may be a material such as silicon nitride or silicon oxide, and the metal oxide material may be a material such as aluminum oxide, hafnium oxide, and tantalum oxide.

In an exemplary implementation mode, the third isolation groove 5 and the fourth isolation groove 4 may be arranged in a multi-purpose manner. For example, the third isolation grooves 5 and the fourth isolation grooves 4 are alternately arranged along a direction close to the opening region 300, as shown in FIG. 2. Or, third isolation grooves 5 are continuously arranged along the direction close to the opening region 300 and fourth isolation grooves 4 are continuously arranged along the direction close to the opening region 300.

In an exemplary implementation mode, as shown in FIG. 2, since the first inorganic material layer 381 and the second inorganic material layer 382 cover the second isolation region 500, the first inorganic material layer 381 and the second inorganic material layer 382 are made of an inorganic material, a stress is relatively large. To relieve the stress of the first inorganic material layer 381 and the second inorganic material layer 382, a protection layer 33 may be disposed on a side of the second isolation region 500 away from the base substrate 10. At least a portion of the protection layer 33 covers the first inorganic material layer 381 and the second inorganic material layer 382 on the second isolation region 500. The protection layer 33 can fill the second isolation region 500, relieve a stress of the second isolation region 500, and improve reliability of a product.

In an exemplary implementation mode, the protective layer 33 may be made of an organic material, for example, a resin.

In an exemplary implementation mode, as shown in FIG. 2, the protection layer 33 can fill the second isolation region 500 to reduce a surface breaking difference with the encapsulation structure 38. For example, a ratio of a thickness between a surface of the protection layer 33 in the second isolation region 500 on a side away from the base substrate 10 and a surface of the base substrate 10 on a side close to the encapsulation structure 38, to a thickness between a surface of the encapsulation structure 38 in the display region 100 on a side away from the base substrate 10 and the surface of the base substrate 10 on the side close to the encapsulation structure 38, is 0.8 to 1.2.

In an exemplary implementation mode, the protection layer 33 may also be partially located in the first isolation region 400, at least partially overlapped or flush with the encapsulation structure 38 in the first isolation region 400, compensating for thinning of the encapsulation structure 38 at an edge of the first isolation region 400.

Generally, a cover plate is disposed on the display substrate. An ink region is disposed on the cover plate, and the ink region covers the frame region in the display substrate. Since there are tolerances in a size and a position of the ink region prepared on the cover plate and there is a tolerance in precision of attachment of a glass cover plate and the display substrate, an area of the ink region is larger than an area of the frame region, which restricts a design of a narrow frame of the opening region.

In an exemplary implementation mode, as shown in FIG. 2, the display substrate according to the embodiment of the present disclosure may further include a shading layer 36 at least partially located in the frame region 200.

In an exemplary implementation mode, the shading layer 36 is located in the frame region 200.

In an exemplary implementation mode, the shading layer 36 is located on a side of the protection layer 33 away from the base substrate 10. The shading layer 36 covers the first isolation region 400 and the second isolation region 500. The shading layer 36 may shade the signal line group 3 in the first isolation region 400 to prevent light reflection. The shading layer 36 covers the entire frame region 200. A metal layer or an opaque black organic coating or a black inorganic coating may be adopted for the shading layer 36.

Figure 5:
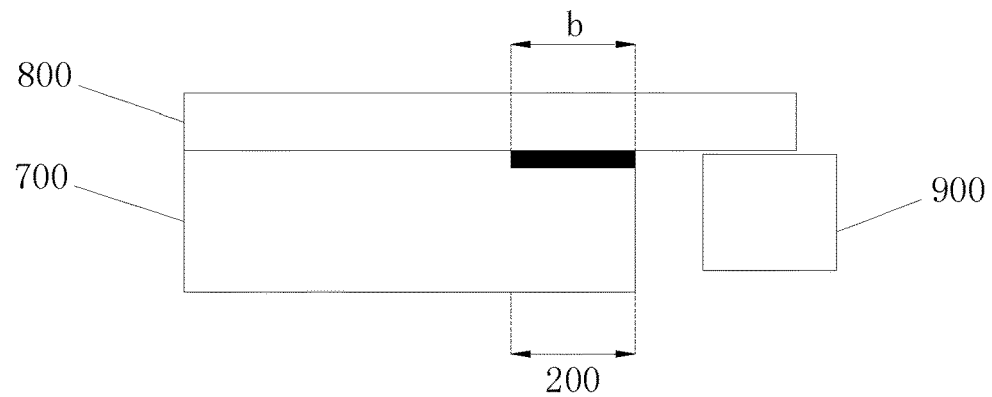
FIG. 5 is a sectional view of a display module according to an embodiment of the present disclosure.

FIG. 5 is a sectional view of a display module according to an embodiment of the present disclosure. As shown in FIG. 5, the embodiment of the present disclosure provides a display module, which includes a display substrate 700 and a cover plate 800 stacked on the display substrate 700. A camera 900 is disposed in an opening region of the display substrate 700, and the cover plate 800 covers the camera 900. A frame of the display module is b. In the display module of the embodiment of the present disclosure, a shading layer 36 is arranged on the display substrate 700, so that an arrangement of the shading layer 36 is not affected by an ink tolerance and an attachment tolerance of the cover plate 800. The frame b of the display module may be equivalent to a frame region 200 of the display substrate 700, so that the frame of the display module can be minimized. Exemplarily, the frame b of the display module may be less than 0.5 mm. For example, a width of the shading layer 36 may be 0.3 mm, and the frame b of the display module is 0.3 mm to 0.4 mm.

In an exemplary implementation mode, as shown in FIG. 2, a buffer layer 34 may be disposed between the shading layer 36 and the protection layer 33, and the buffer layer 34 can buffer a stress generated by forming the opening region 300.

In an exemplary implementation mode, as shown in FIG. 2, a notch may be disposed on a side of the buffer layer 34 close to the opening region 300, and the shading layer 36 fills the notch to prevent the buffer layer 34 from cracking due to a stress generated by forming the opening region 300.

In an exemplary implementation mode, the display substrate according to the embodiment of the present disclosure further includes at least one of a polarizer, a touch layer, and a cover plate disposed on a side of the shading layer 36 away from the base substrate 10.

A technical solution of an embodiment is further described below through a preparation process of a touch substrate according to the embodiment. A "patterning process" mentioned in the embodiment includes treatments such as deposition of a film layer, coating of a photoresist, mask exposure, development, etching, and stripping of photoresist, and is a mature preparation process in the related art. A "photolithography process" mentioned in the embodiment includes film coating, mask exposure, and development, and is a mature preparation process in the related art. Deposition may use a known process such as sputtering, evaporation, chemical vapor deposition, coating may use a known coating process, and etching may use a known method, which are not specifically limited here. In description of this embodiment, it should be understood that a "thin film" refers to a layer of thin film manufactured by treating a material on a base substrate with a deposition or coating process. If a patterning process or a photolithography process is not needed for the "thin film" during an entire manufacturing process, the "thin film" may also be referred to as a "layer". If a patterning process or a photolithography process is needed for the "thin film" during the entire manufacturing process, the "thin film" is referred to as a "thin film" before the patterning process and referred to as a "layer" after the patterning process. A "layer" after a patterning process or a photolithography process includes at least one "pattern".

FIG. 6 to FIG. 19 are schematic diagrams showing a preparation process of a display substrate according to an embodiment. The display substrate of the embodiment includes a display region, a frame region, and an opening region, wherein the opening region is located in the display region, and the frame region is located between the display region and the opening region. The frame region includes a first isolation region and a second isolation region, and the second isolation region is located between the first isolation region and the opening region.

The preparation process of the display substrate according to the embodiment includes following acts.

Figure 6:
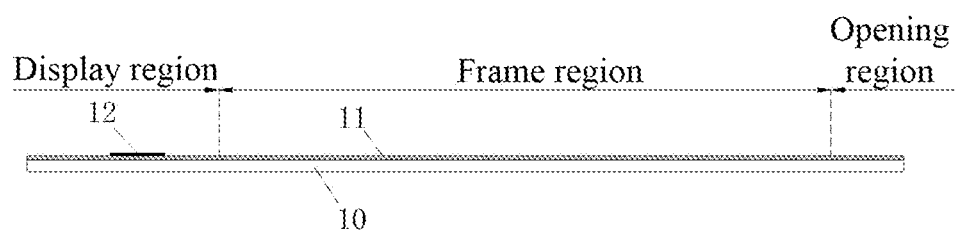
FIG. 6 is a schematic diagram of a display substrate after forming an active layer according to an embodiment of the present disclosure.

(1) Forming a pattern of an active layer on a base substrate. The forming of the pattern of the active layer on the base substrate includes: a layer of buffer thin film is deposited on a base substrate 10 to form a pattern of a buffer layer 11 covering the entire base substrate 10. Subsequently, a layer of an active layer thin film is deposited, and the active layer thin film is patterned through a patterning process to form a pattern of an active layer 12 disposed on the buffer layer 11 in a display region, as shown in FIG. 6. The pattern of the active layer 12 is formed in the display region, and a barrier layer 11 is formed in a frame region and an opening region at this time. The base substrate may be a flexible base substrate or a rigid base substrate, and the flexible base substrate may be made of a material such as Polyimide (PI), Polyethylene Terephthalate (PET), or a surface-treated polymer soft film. The rigid base substrate may be made of a material such as glass or metal foil. The buffer thin film may be made of Silicon Nitride (SiNx), Silicon Oxide (SiOx), or the like, and it may be a single layer or may be a multi-layer structure of silicon nitride/silicon oxide.

Figure 7:
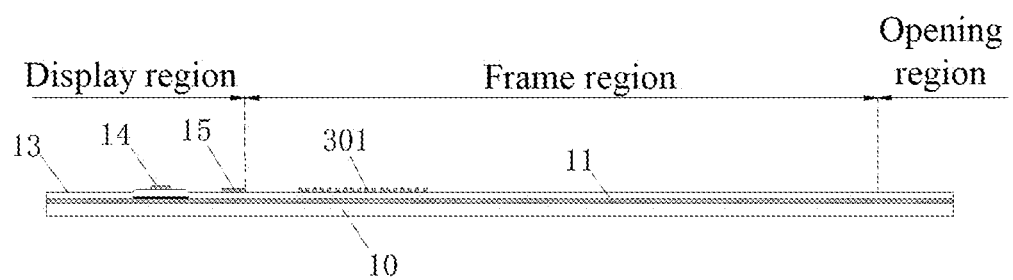
FIG. 7 is a schematic diagram of a display substrate after forming a gate electrode and a first gate line according to an embodiment of the present disclosure.

(2) Forming patterns of a gate electrode and a first signal line group. The forming of the patterns of the gate electrode and the first signal line group includes: a first insulation thin film and a first metal thin film are sequentially deposited on the base substrate 10 on which the aforementioned structures are formed, and the first metal thin film is patterned through a patterning process to form a first insulation layer 13 covering the active layer 12 and the buffer layer 11, and patterns of a first gate electrode 14, a second gate electrode 15, and a first signal line group 301 disposed on the first insulation layer 13, as shown in FIG. 7. The first gate electrode 14 and the second gate electrode 15 are formed in the display region, the first signal line group 301 is formed in the frame region, and the buffer layer 11 and the first insulation layer 13 are formed in the opening region at this time. The first gate electrode 14, the second gate electrode 15, and the first signal line group 301 are disposed in a same layer, and formed through a same process using a same material.

Figure 8:
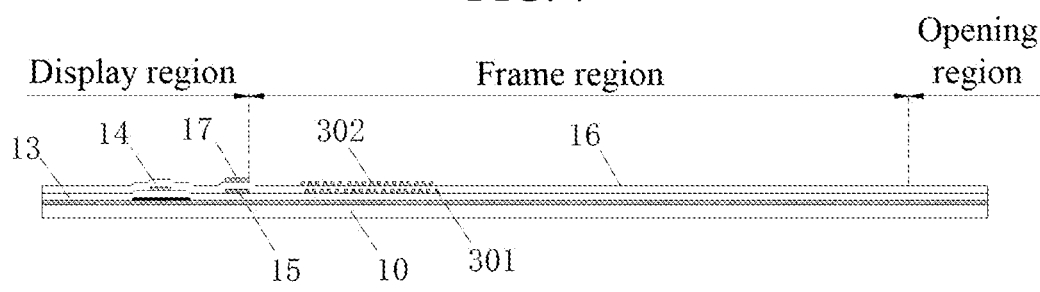
FIG. 8 is a schematic diagram of a display substrate after forming a capacitor electrode and a second gate line according to an embodiment of the present disclosure.

(3) Forming patterns of a capacitor electrode and a second signal line group. The forming of the patterns of the capacitor electrode and the second signal line group includes: a second insulation thin film and a second metal thin film are sequentially deposited on the base substrate 10 on which the aforementioned structures are formed, and the second metal thin film is patterned through a patterning process to form a second insulation layer 16 covering the first gate electrode 14, the second gate electrode 15, and the first insulation layer 13, and patterns of a capacitor electrode 17 and a second signal line group 302 disposed on the second insulation layer 16. A position of the capacitor electrode 17 corresponds to a position of the second gate electrode 15, and the capacitor electrode 17 and the second gate electrode 15 form a capacitor, as shown in FIG. 8. The capacitor electrode 17 is formed in the display region, the second signal line group 302 is formed in the frame region, and the buffer layer 11, the first insulation layer 13, and the second insulation layer 16 are formed in the opening region at this time. The capacitor electrode 17 and the second signal line group 302 are arranged in a same layer, and formed through a same process using a same material.

Figure 9:
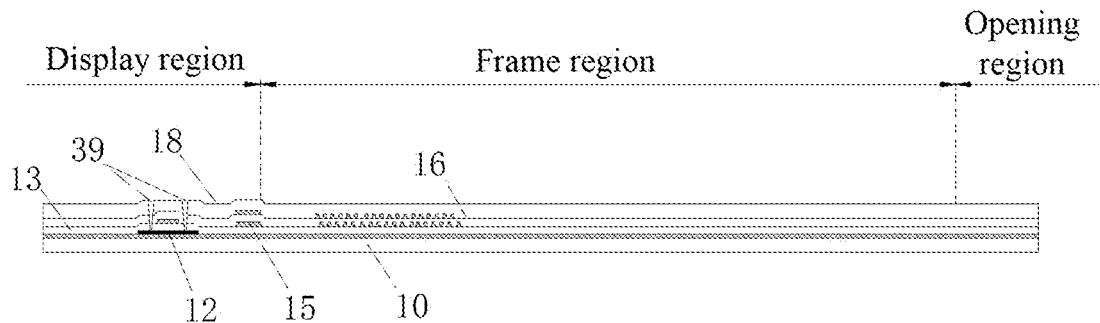
FIG. 9 is a schematic diagram of a display substrate after forming an inorganic insulating layer according to an embodiment of the present disclosure.

(4) Forming a pattern of an inorganic insulation layer provided with a first via. The forming the pattern of the inorganic insulation layer provided with the first via includes: on the base substrate 10 where the aforementioned structures are formed, a third insulation thin film is deposited and is patterned through a patterning process to form a pattern of an inorganic insulation layer 18 provided with two first vias 39 in the display region. The inorganic insulation layer 18, the second insulation layer 16, and the first insulation layer 13 in the two first vias are etched away to expose the active layer 12, as shown in FIG. 9. The two first vias 39 are formed in the display region, and the buffer layer 11, the first insulation layer 13, the second insulation layer 16, and the inorganic insulation layer 18 are formed in the frame region and the opening region at this time.

Figure 10:
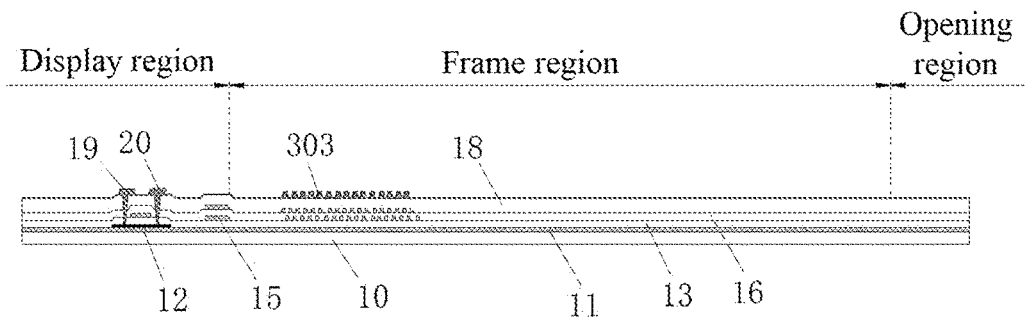
FIG. 10 is a schematic diagram of a display substrate after forming a source electrode, a drain electrode, and a data line according to an embodiment of the present disclosure.

(5) Form patterns of a source electrode, a drain electrode, and a third signal line group. The forming of the patterns of the source electrode, the drain electrode, and the third signal line group includes: a third metal thin film is deposited on the base substrate 10 on which the aforementioned structures are formed, and the third metal thin film is patterned through a patterning process to form patterns of a source electrode 19, a drain electrode 20, and a third signal line group 303 in the display region. The source electrode 19 and the drain electrode 20 are connected with the active layer 12 respectively through the two first vias 39, as shown in FIG. 10. The source electrode 19 and the drain electrode 20 are formed in the display region, the third signal line group 303 is formed in the frame region, and the buffer layer 11, the first insulation layer 13, the second insulation layer 16, and the inorganic insulation layer 18 are formed in the opening region at this time. The source electrode 19, the drain electrode 20, and the third signal line group 303 are arranged in a same layer, and formed through a same process using a same material. The first signal line group 301, the second signal line group 302, and the third signal line group 303 are all signal line groups 3 of the frame region.

In an exemplary implementation mode, vertical projections of at least two of the first signal line group 301, the second signal line group 302, and the third signal line group 303 on the base substrate 10 are at least partially overlapped to reduce an area occupied by the first signal line group 301, the second signal line group 302, and the third signal line group 303, thereby reducing an area of the frame region.

Through the above procedures, preparation of a drive structure layer located in the display region, a signal line group 3 and an insulation layer located in the frame region, an insulation layer in the opening region on the base substrate 10 is completed. The drive structure layer located in the display region includes the active layer 12, the first gate electrode 14, the second gate electrode 15, the capacitor electrode 17, the source electrode 19, and the drain electrode 20. The signal line group 3 located in the frame region includes the first signal line group 301, the second signal line group 302, and the third signal line group 303. The insulation layer located in the opening region includes the first insulation layer 13, the second insulation layer 16, and the inorganic insulation layer 18. The first insulation layer and the second insulation layer are also referred to as Gate Insulators (GIs), and the inorganic insulation layer is also referred to as an Interlayer Dielectric (ILD) layer, the inorganic insulation layer 18 is an inorganic insulation layer.

Figure 11:
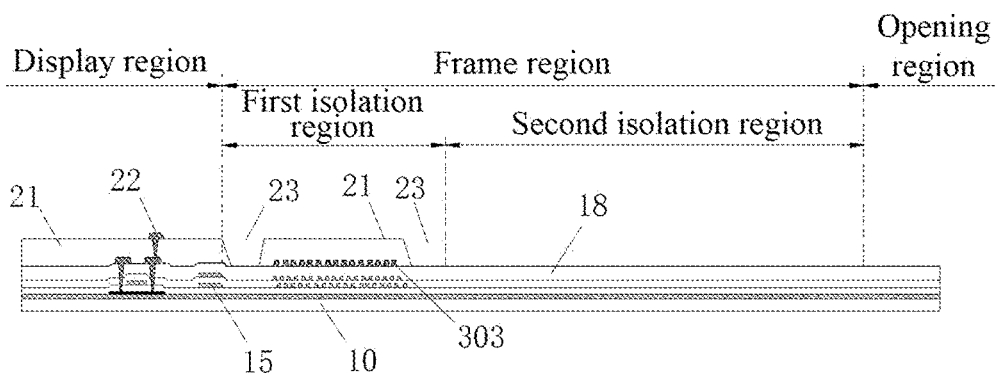
FIG. 11 is a first schematic diagram of a display substrate after forming a first organic insulation layer according to an embodiment of the present disclosure.

(6) Forming a pattern of a first organic insulation layer. The forming of the pattern of the first organic insulation layer includes: a first organic thin film is coated on the base substrate on which the aforementioned patterns are formed, a photolithography process of mask exposure and development is performed on the first organic thin film to form a pattern of a first organic insulation layer 21 in the display region and a first isolation region of the frame region. The pattern of the first organic insulation layer 21 covers the source electrode 19 and the drain electrode 20 in the display region, and covers the third signal line group 303 in the frame region. The first organic insulation layer 21 is provided with a second via and two first groove bodies 23 arranged at intervals. A first groove body 23 includes at least one side wall and a bottom wall. An orthographic projection of the signal line group 3 located in the frame region on the base substrate 10 is located between orthographic projections of bottom walls of the two first groove bodies 23 on the base substrate 10. The two first groove bodies 23 expose the inorganic insulation layer 18 on the frame region. A fourth metal thin film is coated on the first organic insulation layer 21, the fourth metal thin film is patterned through a patterning process, and a connection electrode 22 is formed in the display region, and the connection electrode 22 is connected with the drain electrode 20 through the second via, as shown in FIG. 11. The first organic thin film of a second isolation region in the frame region is etched away to expose the inorganic insulation layer 18 on the second isolation region.

Figure 12:
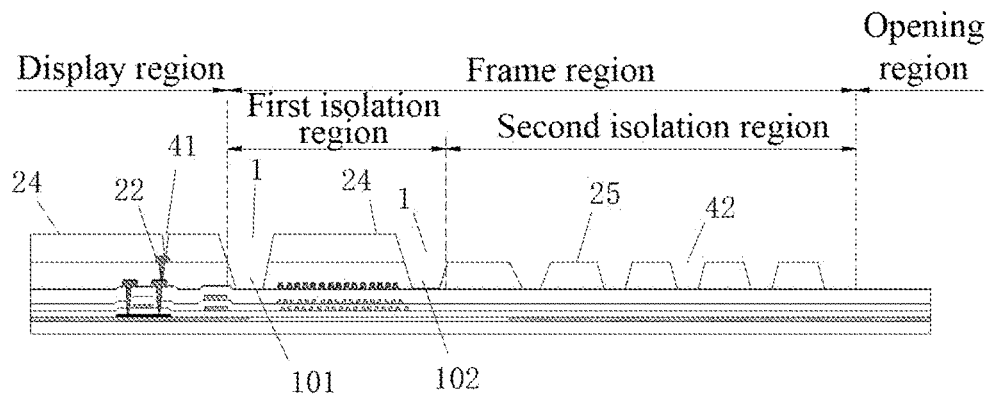
FIG. 12 is a schematic diagram of a display substrate after forming a second organic insulation layer according to an embodiment of the present disclosure.

(7) Forming a pattern of a second organic insulation layer. The forming of the pattern of the second organic insulation layer includes: a second organic thin film is coated on the base substrate on which the aforementioned patterns are formed, a photolithography process of mask exposure and development is performed on the second organic thin film to form a pattern of a second organic insulation layer 24 on the first organic insulation layer 21 in the display region and the first organic insulation layer 21 of the first isolation region in the frame region, and at least one pillar spacer 25 disposed at intervals is formed on the inorganic insulation layer 18 of the second isolation region in the frame region, a fourth isolation groove 4 is formed between adjacent pillar spacers 25, and a third via 41 is disposed in the second organic insulation layer 24 in the display region, and the third via 41 exposes a connection electrode 22. The second organic insulation layer 24 of the first isolation region in the frame region is removed at the two first groove bodies 23 to form two first isolation grooves 1, both of the two first isolation grooves 1 expose the inorganic insulation layer 18 on the frame region. Both of the first organic insulation layer 21 and the second organic insulation layer 24 are isolated by the two first isolation grooves 1. The two first isolation grooves 1 may be a first edge groove 101 and a second edge groove 102, respectively. Vertical projections of the first signal line group 301, the second signal line group 302, and the third signal line group 303 on the base substrate 10 are located between an orthographic projection of a bottom wall of the first edge groove 101 on the base substrate 10 and an orthographic projection of a bottom wall of the second edge groove 102 on the base substrate 10. A second isolation groove 2 is formed in the second organic insulation layer 24, an orthographic projection of the second isolation groove 2 on the base substrate 10 is located between an orthographic projection of the first edge groove 101 on the base substrate 10 and an orthographic projection of the second edge groove 102 on the base substrate 10, as shown in FIG. 12.

Figure 13:
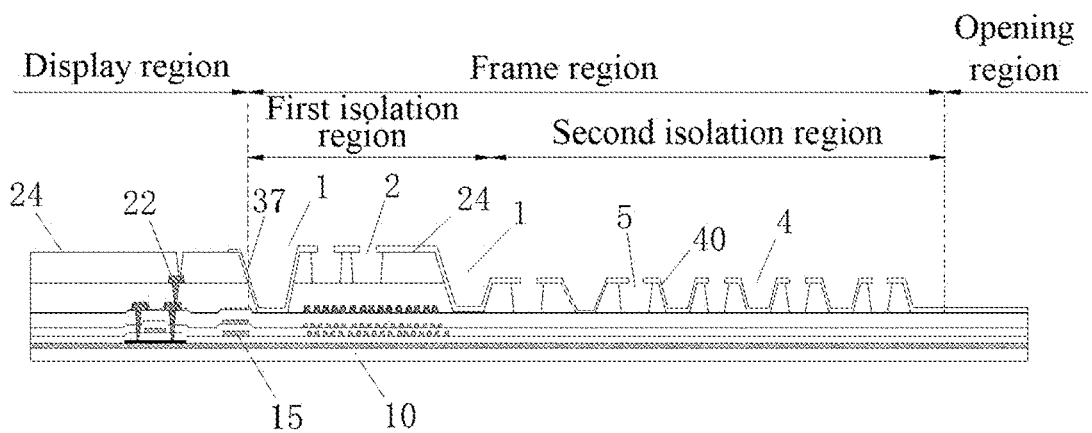
FIG. 13 is a schematic diagram of a display substrate after forming a second isolation groove, a third isolation groove, and a fourth isolation groove according to an embodiment of the present disclosure.

(8) Forming patterns of the second isolation groove and a third isolation groove. The forming of the patterns of the second isolation groove and the third isolation groove includes: a barrier layer material is coated on the base substrate on which the aforementioned patterns are formed, a first barrier layer 37 covering the first isolation region and a second barrier layer 40 covering the second isolation region are formed through a photolithography process of mask exposure and development. The first barrier layer 37 covers a side wall and a bottom wall of the first isolation groove 1, and the second barrier layer 40 covers a pillar spacer 25. Through an etching process, the second isolation groove 2 is formed in the second organic insulation layer 24 on the first isolation region, and the first barrier layer 37 protrudes from a side wall of the second isolation groove 2 to form a first undercut structure; a third isolation groove 5 is formed in the pillar spacer 25 on the second isolation region, and the second barrier layer 40 protrudes from a side wall of the third isolation groove 5 to form a second undercut structure; the third isolation grooves 5 and the fourth isolation grooves 4 are alternately arranged along a direction close to the opening region, as shown in FIG. 13.

Figure 14:
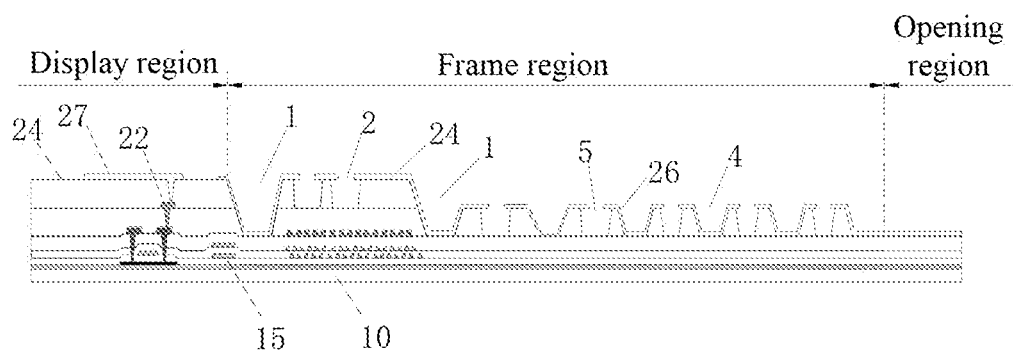
FIG. 14 is a schematic diagram of a display substrate after forming an anode according to an embodiment of the present disclosure.

(9) Forming a pattern of an anode. The forming of the pattern of the anode includes: a transparent conductive thin film is deposited on the base substrate on which the aforementioned patterns are formed, and is patterned through a patterning process to form a pattern of an anode 27 in the display region. The anode 27 is connected with the connection electrode 22 through the third via, as shown in FIG. 14. The anode 27 is formed only in the display region and the transparent conductive thin film in the frame region and the opening region is etched away. The transparent conductive thin film may be made of Indium Tin Oxide (ITO) or Indium Zinc Oxide (IZO).

Figure 15:
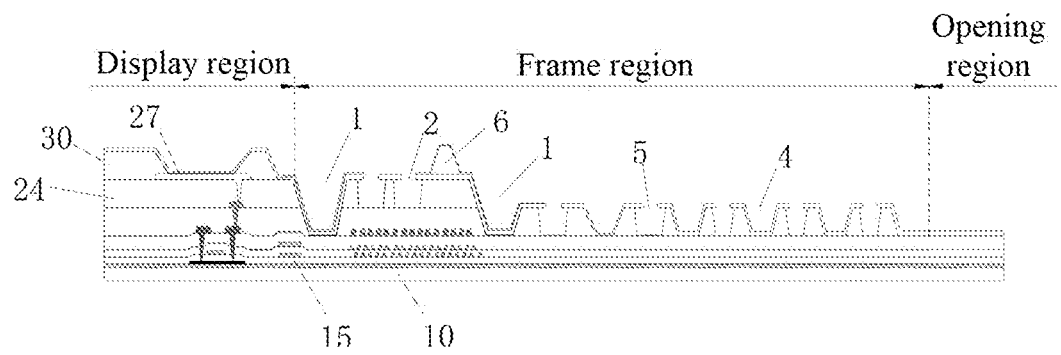
FIG. 15 is a schematic diagram of a display substrate after forming a pixel definition layer according to an embodiment of the present disclosure.

(10) Forming a pixel definition layer. The forming of the pixel definition layer includes: a pixel definition material is coated on the base substrate on which the aforementioned patterns are formed, causing the pixel definition material to form a pixel definition layer 30 in the display region, and causing the pixel definition material to form a dam spacer 6 on the first barrier layer 37 of the first isolation region in the frame region. A pixel opening is provided in the pixel definition layer of the display region and the pixel opening exposes the anode 27, as shown in FIG. 15.

Figure 16:
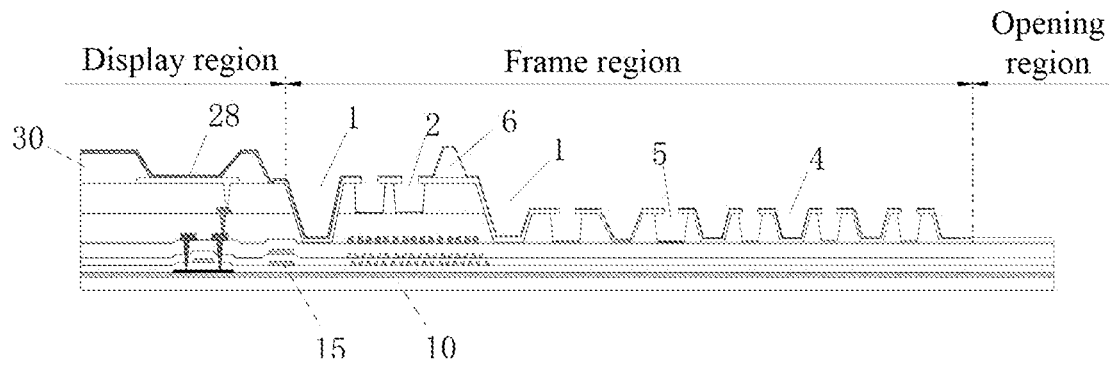
FIG. 16 is a schematic diagram of a display substrate after forming an emitting layer and a cathode according to an embodiment of the present disclosure.

(11) Forming patterns of an emitting layer and a cathode. The forming of the patterns of the emitting layer and the cathode includes: an organic emitting material and a cathode metal thin film are sequentially formed on the base substrate on which the aforementioned patterns are formed to form patterns of an emitting layer 28 and a cathode. In the display region, the emitting layer 28 is connected with the anode 27 in the pixel opening region defined by the pixel definition layer, and the cathode 31 is provided on the emitting layer 28. In the frame region, the emitting layer 28 and the cathode have poor coverage at undercut structures of the second isolation groove 2 and the third isolation groove 5, the emitting layer and the cathode 28 are broken at the second isolation groove 2 and the third isolation groove 5, thereby isolating the emitting layer and the cathode 28 between the display region and the opening region, preventing water and oxygen around the opening region from entering the display region along the emitting layer, and improving service life of a device, as shown in FIG. 16. The emitting layer 28 mainly includes an Emitting Layer (EML). In actual implementation, the emitting layer may include a hole injection layer, a hole transport layer, an emitting layer, an electron transport layer, and an electron injection layer disposed sequentially to improve an efficiency of injecting electrons and holes into the emitting layer. The cathode may be made of one of metal materials such as Magnesium (Mg), Argentum (Ag), Aluminum (Al), Copper (Cu), Lithium (Li), or an alloy of the above metals.

Figure 17:
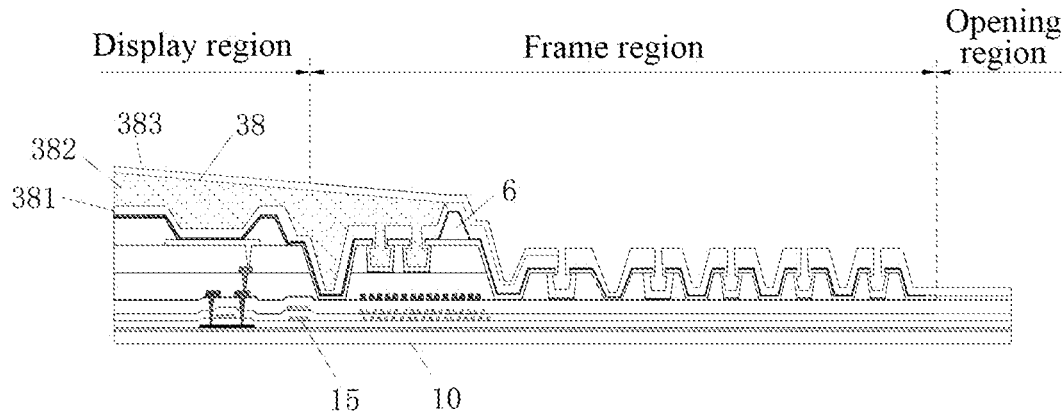
FIG. 17 is a schematic diagram of a display substrate after forming an encapsulation structure according to an embodiment of the present disclosure.

(12) Forming a pattern of an encapsulation structure. The forming of the pattern of the encapsulation structure includes: a first inorganic thin film is deposited on the base substrate on which the aforementioned patterns are formed; the first inorganic thin film covers the display region, the frame region, and the opening region to form a pattern of a first inorganic material layer 381. Subsequently, an organic material layer 383 is formed on the second organic insulation layer 24 of the first isolation region in the display region and the frame region, and the organic material layer 383 is isolated by the dam spacer 6 of the first isolation region. Subsequently, a second inorganic thin film is deposited, and the second inorganic thin film covers the display region, the frame region, and the opening region to form a pattern of a second inorganic layer 382, as shown in FIG. 17. The first inorganic material layer 381, the organic material layer 383, and the second inorganic material layer 382 form an encapsulation structure 38.

Figure 18:
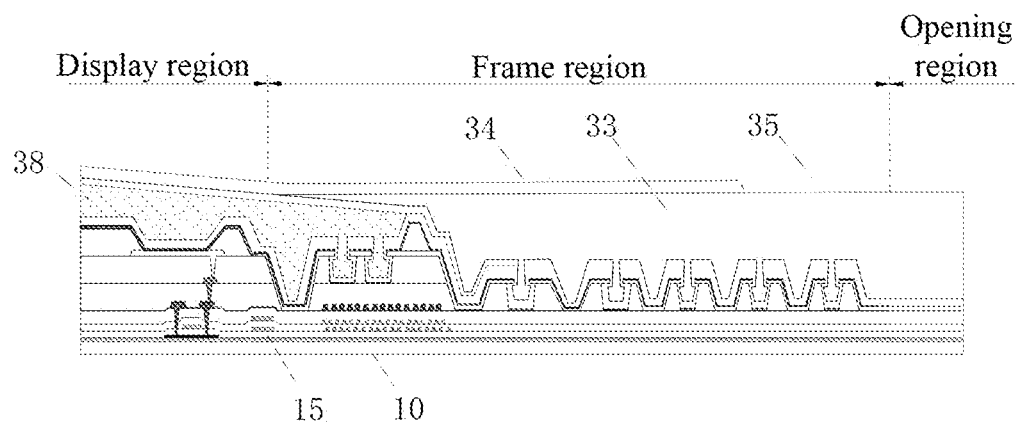
FIG. 18 is a schematic diagram of a display substrate after forming a protection layer according to an embodiment of the present disclosure.

(13) Forming a pattern of a protection layer. The forming of the pattern of the protection layer includes: a protection layer material is deposited on the base substrate on which the aforementioned patterns are formed, at least a portion of the protection layer material covers the frame region to form a protection layer 33, and the protection layer 33 fills the second isolation region in the frame region. Subsequently, a buffer layer 34 is formed on the protection layer 33 and a notch 35 may be disposed on a side of the buffer layer 34 close to the opening region. The protection layer 33 can fill a segment difference formed by the encapsulation structure to ensure flatness of a shading layer formed subsequently, as shown in FIG. 18. The buffer layer 34 may include an inorganic insulation material, such as silicon nitride, silicon oxide, or silicon oxynitride.

Figure 19:
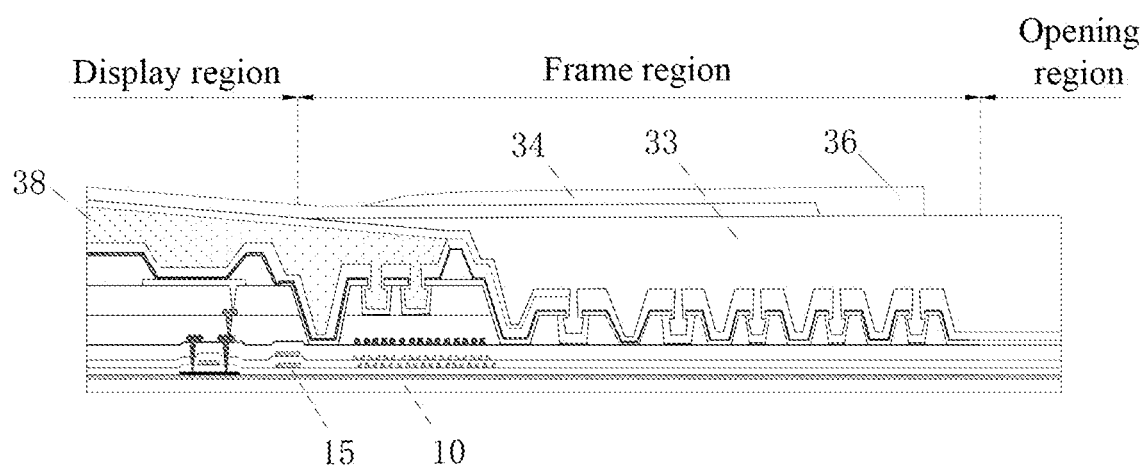
FIG. 19 is a schematic diagram of a display substrate after forming a shading layer according to an embodiment of the present disclosure.

(14) Forming a pattern of a shading layer. The forming of the pattern of the shading layer includes: a shading material thin film is deposited on the base substrate on which the aforementioned patterns are formed, the shading material thin film is patterned through a patterning process to form a pattern of a shading layer 36 on the protection layer 33, and the shading layer 36 fills a notch, as shown in FIG. 19.

(15) Finally, each structural film layer of the opening region and the base substrate are etched away through a laser and other related processes to form an OLED display substrate provided with the opening region according to the embodiment of the present disclosure, as shown in FIG. 2. In actual implementation, each structural film layer of the opening region and the base substrate may be all etched away to form a through hole, or part of structural film layers of the opening region may be etched away to form a blind hole, which is determined according to actual needs, and is not specifically limited in the embodiment of the present disclosure.

An embodiment of the present disclosure further provides a display apparatus including the display substrate of the above embodiments. The display apparatus may be any product or component with a display function, such as a mobile phone, a tablet computer, a television, a display, a laptop computer, a digital photo frame, and a navigator, or may be a product or component with functions of Virtual Reality (VR), Augmented Reality (AR), and 3D display.

The accompanying drawings in the present disclosure only relate to structures involved in the present disclosure, and another structure may refer to a common design. The embodiments in the present disclosure, i.e., features in the embodiments, may be combined with each other to obtain new embodiments if there is no conflict.

Those of ordinary skill in the art should understand that modification or equivalent replacement may be made to the technical solutions of the present disclosure without departing from the spirit and the scope of the technical solutions of the present disclosure, and should all fall within the scope of the claims of the present disclosure.

The invention claimed is:

1. A display substrate, comprising a display region, an opening region, and a frame region located between the display region and the opening region; the frame region at least comprises a first isolation region, the first isolation region comprises a base substrate, at least one inorganic insulation layer disposed on the base substrate, at least one organic insulation layer disposed on a side of the at least one inorganic insulation layer away from the base substrate, and an encapsulation structure disposed on a side of the at least one organic insulation layer away from the base substrate; the encapsulation structure at least comprises one organic material layer; the display substrate comprises at least two first isolation grooves, and the at least two first isolation grooves penetrate the at least one organic insulation layer; the at least two first isolation grooves at least comprise a first edge groove and a second edge groove; in first isolation grooves, of which an orthographic projection of a bottom wall on the base substrate is overlapped with an orthographic projection of the organic material layer on the base substrate, a first isolation groove which is closest to a side of the display region is the first edge groove; in the first isolation grooves, of which an orthographic projection of a bottom wall on the base substrate is not overlapped with the orthographic projection of the organic material layer on the base substrate, a first isolation groove which is closest to a side of the display region is the second edge groove; the display substrate further comprises at least one signal line group disposed on the base substrate, and an orthographic projection of the at least one signal line group on the base substrate is located between an orthographic projection of a bottom wall of the first edge groove on the base substrate and an orthographic projection of a bottom wall of the second edge groove on the base substrate.

2. The display substrate according to claim 1, wherein the first isolation region comprises a first organic insulation layer and a second organic insulation layer which are stacked, and the first isolation groove penetrates the first organic insulation layer and the second organic insulation layer.

3. The display substrate according to claim 1, wherein the first isolation groove comprises at least one side wall and a bottom wall, and a first barrier layer is disposed on the at least one side wall and the bottom wall of at least one of the first isolation grooves.

4. The display substrate according to claim 1, at least one second isolation groove is further disposed in the at least one organic insulation layer, the at least one second isolation groove has a first undercut structure, the first isolation region further comprises an emitting layer disposed on the at least one organic insulation layer, and the second isolation groove isolates the emitting layer.

5. The display substrate according to claim 4, wherein an orthographic projection of the at least one second isolation groove on the base substrate is overlapped with the orthographic projection of the organic material layer on the base substrate.

6. The display substrate according to claim 4, wherein an orthographic projection of the at least one second isolation groove on the base substrate is located between an orthographic projection of the first edge groove on the base substrate and an orthographic projection of the second edge groove on the base substrate.

7. The display substrate according to claim 1, wherein the first isolation region further comprises at least one dam spacer, the at least one dam spacer is disposed on a side of the at least one organic insulation layer away from the base substrate, an orthographic projection of the dam spacer on the base substrate is located between an orthographic projection of the first edge groove on the base substrate and an orthographic projection of the second edge groove on the base substrate, the encapsulation structure comprises a first encapsulation material layer, a second encapsulation material layer, and a third encapsulation material layer which are stacked in sequence, both the first encapsulation material layer and the third encapsulation material layer are made of inorganic materials, the second encapsulation material layer comprises at least one organic material layer, and the dam spacer isolates the at least one organic material layer from the opening region.

8. The display substrate according to claim 1, wherein, the frame region further comprises a second isolation region, the second isolation region is located between the first isolation region and the opening region, the second isolation region comprises at least two pillar spacers, a third isolation groove is formed between adjacent pillar spacers, and the third isolation groove has a second undercut structure.

9. The display substrate according to claim 8, wherein a fourth isolation groove is further formed between the adjacent pillar spacers, the fourth isolation groove comprises at least one side wall and a bottom wall, and a second barrier layer is disposed on the at least one side wall and at least one bottom wall of the fourth isolation groove.

10. The display substrate according to claim 8, wherein the pillar spacers and the at least one organic insulation layer are arranged in a same layer.

11. The display substrate according to claim 9, wherein the first isolation groove comprises at least one side wall and a bottom wall, a first barrier layer is disposed on at least one side wall and at least one bottom wall of at least one of the first isolation grooves, the first barrier layer and the second barrier layer are arranged in a same layer.

12. The display substrate according to claim 8, wherein a protection layer is disposed on a side of the encapsulation structure away from the base substrate, and at least a portion of the protection layer covers the second isolation region.

13. The display substrate according to claim 12, wherein a ratio of a thickness between a surface of the protection layer in the second isolation region on a side away from the base substrate and a surface of the base substrate on a side close to the encapsulation structure, to a thickness between a surface of the encapsulation structure in the display region on a side away from the base substrate and the surface of the base substrate on the side close to the encapsulation structure, is 0.8 to 1.2.

14. The display substrate according to claim 13, further comprises a shading layer located on a side of the protection layer away from the base substrate.

15. The display substrate according to claim 14, wherein a metal layer or an opaque black organic coating or a black inorganic coating is adopted for the shading layer.

16. The display substrate according to claim 14, wherein a buffer layer is disposed between the shading layer and the protection layer.

17. The display substrate according to claim 16, wherein a notch is disposed on a side of the buffer layer close to the opening region, and the shading layer fills the notch.

18. The display substrate according to claim 1, wherein the first isolation region comprises at least two signal line groups which are stacked, the at least two signal line groups are insulated from each other, and orthographic projections of the at least two signal line groups on the base substrate are at least partially overlapped.

19. A display apparatus, comprising the display substrate according to claim 1.

\* \* \* \* \*